United States Patent
Van Der Pasch et al.

(10) Patent No.: US 9,575,416 B2
(45) Date of Patent: Feb. 21, 2017

(54) LITHOGRAPHIC APPARATUS, DEVICE MANUFACTURING METHOD AND DISPLACEMENT MEASUREMENT SYSTEM

(71) Applicant: ASML Netherlands B.V., Veldhoven (NL)

(72) Inventors: Engelbertus Antonius Fransiscus Van Der Pasch, Oirschot (NL); Ruud Antonius Catharina Maria Beerens, Roggel (NL); Martinus Agnes Willem Cuijpers, Veldhoven (NL); Christiaan Alexander Hoogendam, Westerhoven (NL); Fransiscus Mathijs Jacobs, Asten (NL); Willem Herman Gertruda Anna Koenen, Roermond (NL); Erik Roelof Loopstra, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 133 days.

(21) Appl. No.: 14/419,910

(22) PCT Filed: Aug. 2, 2013

(86) PCT No.: PCT/EP2013/066242
§ 371 (c)(1),
(2) Date: Feb. 5, 2015

(87) PCT Pub. No.: WO2014/029601
PCT Pub. Date: Feb. 27, 2014

(65) Prior Publication Data
US 2015/0212428 A1    Jul. 30, 2015

Related U.S. Application Data

(60) Provisional application No. 61/692,580, filed on Aug. 23, 2012.

(51) Int. Cl.
*G03F 7/20* (2006.01)

(52) U.S. Cl.
CPC ....... *G03F 7/70483* (2013.01); *G03F 7/70725* (2013.01); *G03F 7/70775* (2013.01)

(58) Field of Classification Search
CPC ............. G03F 7/70483; G03F 7/70725; G03F 7/70775; G03F 7/70716; G03F 9/7011
See application file for complete search history.

(56) References Cited

U.S. PATENT DOCUMENTS 5,182,615 A    1/1993    Kurosawa et al.
6,819,425 B2   11/2004   Kwan
(Continued)

FOREIGN PATENT DOCUMENTS

EP    0 412 756    2/1991
EP    1 762 897    3/2007
(Continued)

OTHER PUBLICATIONS

Written Opinion dated Feb. 13, 2014 in corresponding International Patent Application No. PCT/EP2013/066242.
(Continued)

*Primary Examiner* — Toan Ton
*Assistant Examiner* — Michelle M Iacoletti
(74) *Attorney, Agent, or Firm* — Pillsbury Winthrop Shaw Pittman LLP

(57) ABSTRACT

A lithographic apparatus including a moveable object (WT) and a displacement measuring system arranged to determine a position quantity of the moveable object. The displacement measuring system includes an encoder (BC) and a grid structure. One of the encoder and the grid structure is connected to the moveable object. The grid structure includes a high precision grid portion (HG) and a low precision grid portion (LG). The encoder is arranged to
(Continued)

cooperate with the high precision grid portion to determine the position quantity relative to the grid structure with a high precision. The encoder is arranged to cooperate with the low precision grid portion to determine the position quantity relative to the grid structure with a low precision.

11 Claims, 2 Drawing Sheets

(56) References Cited

U.S. PATENT DOCUMENTS

| | | | |
|---|---|---|---|
| 7,046,266 | B1 | 5/2006 | Retschke et al. |
| 7,161,659 | B2 | 1/2007 | Van Den Brink et al. |
| 8,488,106 | B2 | 7/2013 | Shibazaki et al. |
| 2002/0041380 | A1 | 4/2002 | Kwan |
| 2005/0133705 | A1* | 6/2005 | Hare .................... G01D 5/2458 250/231.13 |
| 2007/0256313 | A1 | 11/2007 | McAdam |
| 2009/0153822 | A1 | 6/2009 | Shibazaki |
| 2009/0190110 | A1 | 7/2009 | Shibazaki |
| 2010/0073652 | A1* | 3/2010 | Shibazaki ............... G03F 7/707 355/53 |
| 2013/0161500 | A1* | 6/2013 | Xie .................... G01D 5/34792 250/231.1 |

FOREIGN PATENT DOCUMENTS

| | | |
|---|---|---|
| JP | H03-068127 | 3/1991 |
| JP | H03-267720 | 11/1991 |
| JP | H06-43939 | 2/1994 |
| JP | 2002-151405 | 5/2002 |
| JP | 2002-520644 | 7/2002 |
| JP | 2007-248176 | 9/2007 |
| JP | 2008-506104 | 2/2008 |
| JP | 2009-036637 | 2/2009 |
| JP | 2010-062210 | 3/2010 |
| WO | 00/02424 | 1/2000 |
| WO | 2006/003452 | 1/2006 |
| WO | 2009/084244 | 7/2009 |
| WO | 2011/081215 | 7/2011 |

OTHER PUBLICATIONS

International Search Report mailed Feb. 13, 2014 in corresponding International Patent Application No. PCT/EP2013/066242.
Japanese Office Action mailed Dec. 14, 2015 in corresponding Japanese Patent Application No. 2015-527834.
Korean Office Action mailed Mar. 23, 2016 in corresponding Korean Patent Application No. 10-2015-7006205.

* cited by examiner

LITHOGRAPHIC APPARATUS, DEVICE MANUFACTURING METHOD AND DISPLACEMENT MEASUREMENT SYSTEM

CROSS-REFERENCE TO RELATED APPLICATIONS

This application is a the U.S. national phase entry of International Patent Application No. PCT/EP2013/066242, filed Aug. 2, 2013, which claims the benefit of priority from U.S. provisional application 61/692,580, which was filed on 23 Aug. 2012, and which is incorporated herein in its entirety by reference.

FIELD

The present invention relates to a lithographic apparatus, a method for manufacturing a device and a displacement measurement system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion on a substrate, e.g., a silicon wafer. Transfer of the pattern is typically via imaging onto a layer of radiation-sensitive material provided on the substrate. In general, a single substrate will contain a network of adjacent target portions that are successively patterned. Conventional lithographic apparatus include so-called steppers, in which each target portion is irradiated by exposing an entire pattern onto the target portion at once. Conventional lithographic apparatus include so-called scanners, in which each target portion is irradiated by scanning the pattern through a radiation beam in a given direction while synchronously scanning the substrate parallel or anti-parallel to this direction. It is also possible to transfer the pattern from the patterning device to the substrate by imprinting the pattern onto the substrate.

For measuring displacements in a lithographic apparatus, there is provided a displacement measuring system that is configured to determine a position of the substrate and/or the patterning device. The displacement measuring system may have at least one encoder constructed and arranged to measure a position with respect to a grid structure provided with a repetitive pattern. It may be difficult to manufacture a grid structure at the required size and precision.

SUMMARY

It is desirable to provide a lithographic apparatus with an improved displacement measuring system.

According to an embodiment of the invention, there is provided a lithographic apparatus comprising a moveable object and a displacement measuring system. The displacement measuring system is arranged to determine a position quantity of the moveable object. The displacement measuring system comprises an encoder and a grid structure. One of the encoder and the grid structure is connected to the moveable object. The grid structure comprises a high precision grid portion and a low precision grid portion. The encoder is arranged to cooperate with the high precision grid portion to determine the position quantity relative to the grid structure with a high precision. The encoder is arranged to cooperate with the low precision grid portion to determine the position quantity relative to the grid structure with a low precision.

According to an embodiment of the invention, there is provided device manufacturing method for transferring a pattern from a patterning device onto a substrate using a lithographic apparatus. The lithographic apparatus comprises a moveable object. The method comprises moving the moveable object. The method comprises measuring a position quantity of the moveable object with a high precision. The method comprises measuring the position quantity of the moveable object with a low precision.

According to a further embodiment there is provided a displacement measuring system configured to determine a position quantity of a moveable object. The displacement measuring system comprises an encoder and a grid structure. One of the encoder and the grid structure is connectable to the moveable object. The grid structure comprises a high precision grid portion and a low precision grid portion. The encoder is arranged to cooperate with the high precision grid portion to determine the position quantity relative to the grid structure with a high precision. The encoder is arranged to cooperate with the low precision grid portion to determine the position quantity relative to the grid structure with a low precision.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
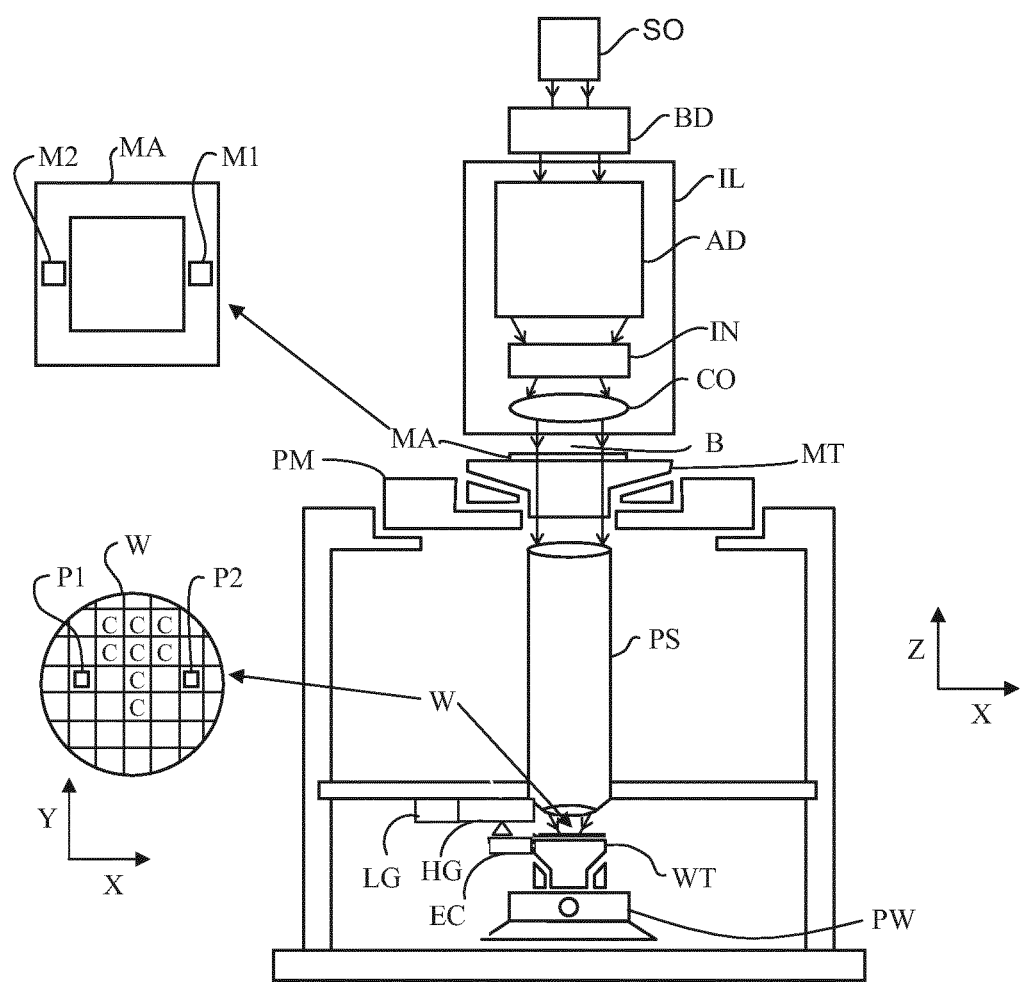
FIG. 1 depicts a lithographic apparatus according to an embodiment of the invention; and, FIG. 2 depicts a substrate table and a displacement measurement system according to a further embodiment.

FIG. 1 schematically depicts a lithographic apparatus according to one embodiment of the invention. The apparatus includes an illumination system IL, a support structure MT, a substrate table WT and a projection system PS. The illumination system IL is configured to condition a radiation beam B. The support structure MT, e.g. a patterning device support or a mask table, is constructed to support a patterning device MA. The support structure MT is connected to a first positioning device PM configured to accurately position the patterning device MA in accordance with certain parameters. The substrate table WT, e.g., a wafer table or a substrate support, is constructed to hold a substrate, e.g., a resist-coated wafer W. The substrate table WT is connected to a second positioning device PW configured to accurately position the substrate W in accordance with certain parameters. The projection system PS is configured to project a pattern imparted to the radiation beam B by patterning device MA onto a target portion C of the substrate W.

The radiation beam B may be UV radiation or any other suitable radiation. The term "radiation beam" used herein encompasses all types of electromagnetic radiation, including ultraviolet (UV) radiation, e.g., having a wavelength of or about 365, 248, 193, 157 or 126 nm. The electromagnetic radiation may include extreme ultra-violet (EUV) radiation, e.g., having a wavelength in the range of 5-20 nm). The electromagnetic radiation may include particle beams, such as ion beams or electron beams.

The illumination system IL may include various types of optical components, such as refractive, reflective, magnetic, electromagnetic, electrostatic or other types of optical components, or any combination thereof, for directing, shaping, or controlling radiation.

Referring to FIG. 1, the illumination system IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD including, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may include an adjuster AD configured to adjust the angular intensity distribution of the radiation beam. In addition, the illumination system IL may include various other components, such as an integrator IN and a condenser CO. The illumination system IL may be used to condition the radiation beam, to have a desired uniformity and intensity distribution in its cross-section.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section so as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include reticles, masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the radiation beam being used, or for other factors such as the use of an immersion liquid or the use of a vacuum.

The lithographic apparatus may be of a type having one or more substrate tables WT or one or more support structures MT. The additional wafer tables WT or support structures MT may be used in parallel, or preparatory steps may be carried out on one or more substrate tables WT or support structures MT while one or more other tables or supports are being used for projecting the radiation beam B onto the substrate W. In addition to one or more substrate tables WT, the lithographic apparatus may have a measurement table arranged to hold measurement equipment. The measurement table may not be arranged to hold a wafer.

The lithographic apparatus may also be of a type wherein at least a portion of the substrate may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques can be used to increase the numerical aperture of the projection system PS. The term "immersion" as used herein does not mean that a structure, such as a substrate W, must be submerged in liquid, but rather only means that a liquid is located between the projection system PS and the substrate W during exposure.

The radiation beam B is incident on the patterning device MA, which is held on the support structure, and is patterned by the patterning device MA. Having traversed the patterning device MA, the radiation beam B passes through the projection system PS, which focuses the beam onto a target portion C of the substrate W. With the aid of the second positioning device PW and a displacement measuring system (comprising e.g. a linear encoder, an interferometric device, or capacitive sensor), the substrate table WT can be moved accurately, e.g. so as to position different target portions C in the path of the radiation beam B. Similarly, the first positioning device PM and another displacement measuring system (which is not explicitly depicted in FIG. 1) can be used to accurately position the patterning device MA with respect to the path of the radiation beam B. In general, movement of the support structure MT may be realized with the aid of a long-stroke module and a short-stroke module, both of which form part of the first positioning device PM. The long-stroke module is arranged to move the short-stroke module over a large range with a low accuracy. The short-stroke module is arranged to move relative to the long-stroke module over a short range with a high accuracy. Similarly, movement of the substrate table WT may be realized using a long-stroke module and a short-stroke module, both of which form part of the second positioner PW. In the case of a stepper, as opposed to a scanner, the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C.

The depicted apparatus could be used in at least one of the three following modes:

In the first mode, the so-called step mode, the support structure MT and the substrate table WT are kept essentially stationary, while an entire pattern imparted to the radiation beam is projected onto a target portion C at one time. The substrate table WT is then shifted in the X and/or Y direction so that a different target portion C can be exposed to the radiation beam B. In step mode, the maximum size of the exposure field limits the size of the target portion C imaged in a single static exposure.

In the second mode, the so-called scan mode, the support structure MT and the substrate table WT are scanned synchronously while a pattern imparted to the radiation beam is projected onto a target portion C. The velocity and direction of the substrate table WT relative to the support structure MT may be determined by the (de-)magnification and image reversal characteristics of the projection system PS. In scan mode, the maximum size of the exposure field limits the width of the target portion C in a single dynamic exposure, whereas the length of the scanning motion determines the length of the target portion C.

In a third mode, the support structure MT is kept essentially stationary holding a programmable patterning device. The substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus comprises the displacement measuring system to determine a position quantity of the substrate table WT. Instead of determining a position quantity of the substrate table WT, the displacement measuring system may be used to determine a position quantity of any moveable object in the lithographic apparatus, such as the support structure MT. The position quantity may be any type of quantity which can be used to determine the position of the substrate table WT, such as position, velocity or acceleration.

The displacement measuring system comprises an encoder EC and a grid structure. The encoder EC is arranged to cooperating with the grid structure to measure the position quantity relative to the grid structure. The grid structure comprises a high precision grid portion HG and a low precision grid portion LG. The encoder EC is arranged to cooperate with the high precision grid portion HG to determine the position quantity relative to the grid structure with a high precision. The encoder EC is arranged to cooperate with the low precision grid portion HG to determine the position quantity relative to the grid structure with a low precision. The position quantity with high precision is determined more accurately than the position quantity with low precision.

The high precision grid portion HG may be adjacent to the low precision grid portion LG. The high precision grid portion HG and the low precision grid portion LG may be adjacent with a minimal or no gap between the two portions. It is easier to produce a grid structure comprising a low precision grid portion LG and a high precision grid portion HG because the size of the high precision grid portion HG may be smaller. The high precision grid portion HG may be most difficult to manufacture.

As depicted in FIG. 1, the grid structure is provided to a frame connected with the projection system PS. The encoder EC is connected to the substrate table WT. In an embodiment, the encoder EC is provided to the frame connected to the projection system PS, and the grid structure is provided to the substrate table WT.

The high precision grid portion HG may be provided relatively close to the projection system PS. During exposure and/or alignment the encoder may be measuring the position relative to the high precision grid portion HG.

The low precision grid portion LG may be provided further away from the projection system PS than the high precision grid portion HG. During movement of the substrate table WT away from the projection system PS, no pattern may be projected onto the substrate W on the substrate table WT. Although the movements of the substrate table WT are still under control of the displacement measurement system, the precision requirements may be less strict since there is no pattern being projected.

The encoder EC cooperating with the low precision grid portion LG may measure with a precision between about 1 and 0.03 micrometer, for example between about 0.5 and 0.1 micrometer and for example around 0.25 micrometer. The encoder EC cooperating with the high precision grid portion HP may measure with a precision smaller than about 5 nanometer, for example less than about 1 nanometer and for example less than about 0.5 nanometer.

The high precision grid portion HG may be measuring with an accuracy which is at least 10 times, for example 100 times, for example 500 times more accurate than the low precision grid portion LG.

Figure 2:
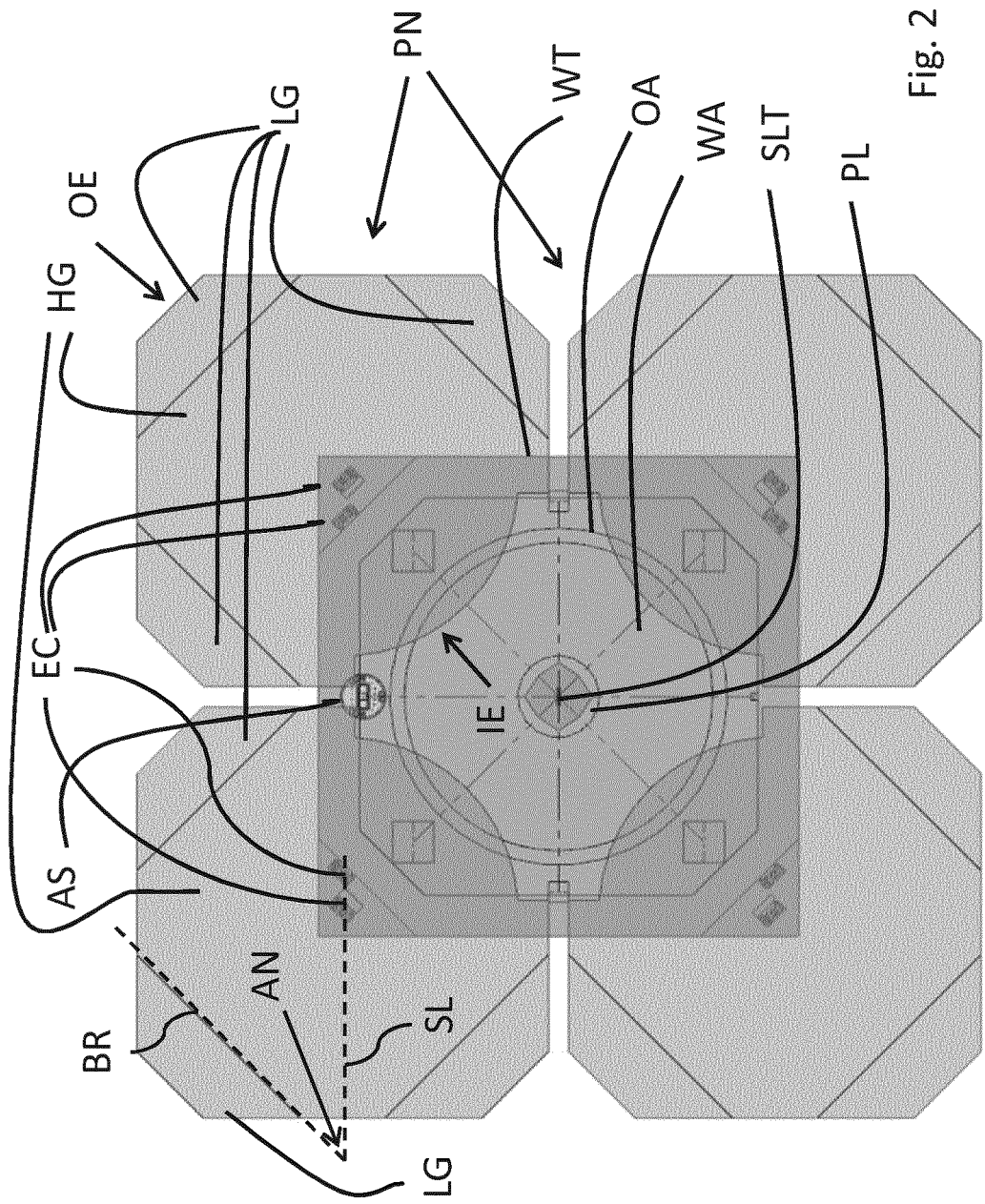

FIG. 2 depicts a substrate table WT cooperating with a displacement measurement system according to an embodiment. The substrate table WT of FIG. 2 is left largely transparent such that the position of the features of the substrate table WT with respect to the grid structure becomes visible. FIG. 2 gives a view from down up towards the substrate table WT and the grid structure. The exposure slit SLT of the projection system PS and the area WA where the substrate W is clamped are depicted. The substrate table WT may be moveable over the full surface of the grid structure.

An encoder EC is mounted on a corner of the substrate table WT. In this embodiment, there are two encoders EC in each of the four corners of the substrate table WT.

The encoders EC determine the position quantity with respect to the grid structure. The grid structure comprises the high precision grid portion HG and the low precision grid portion LG. The grid structure has a two-dimensional pattern, so the encoder EC is able to cooperate with the two-dimensional pattern to determine the position quantity in at least two directions. In an embodiment, at least one of the high precision grid portion HG and the low precision grid portion LG may have the two-dimensional pattern. The two-dimensional pattern may comprise a block pattern.

The grid structure is provided with four parts PN. Each part PN is provided with a high precision grid portion HG and a low precision grid portion LG. Each part may be cooperating with a dedicated encoder EC, i.e., an encoder EC cooperates only with one of the four parts PN. An encoder EC may be dedicated to one of the four parts PN during a certain amount of time, for example a time in which a pattern is projected onto the substrate W.

The displacement measuring system may be provided with a pair of encoders EC to maintain precision during a transfer from measuring on the high precision grid portion HG to the low precision grid LG. The part PN may be cooperating with a dedicated encoder pair.

There may be provided three parts PN, each part PN cooperating with a dedicated pair of encoders.

There may be provided four parts PN, each part PN cooperating with a dedicated pair of encoders EC making a total number of eight encoders EC on the substrate table WT. The displacement measurement system is over-determined in this way such that deformations of the substrate table WT may be measured with the displacement measurement system.

The portion PN may comprise one high precision grid portion HG and three low precision grid portions LG as depicted.

The high precision grid portion HG may be provided closer to the projection system PS than the low precision grid portion LG. The low precision grid portion LG may be provided further away from the projection system PS than the high precision grid portion HG.

The pair of encoders EC may also maintain precision during transfer of the pair of encoders EC from measuring on the high precision grid portion HG to another high precision grid portion HG. This may result in substantially no loss of measurement accuracy of the displacement measuring system during the transfer.

An alignment sensor AS is provided to the substrate table WT. During alignment, the alignment sensor AS is moved underneath the exposure slit SLT so that the alignment sensor AS can be used to determine the alignment of the substrate table WT with respect to an alignment pattern projected by the projection system PS. The alignment pattern that is projected may be created by the patterning device alignment marks M1, M2. The encoders EC on the substrate table WT are cooperating with the high precision grid portion HG during alignment of the patterned radiation beam with the substrate W. In this way a high accuracy alignment is assured.

A straight line SL in FIG. 2 indicates a direction in which a pair of encoders EC have an offset relative to each other. The direction of the offset is not parallel to a border BR between the high precision grid portion HG and the low precision grid portion LG. A smallest angle AN between the straight line SL and the border BR may be between about 10 and 80 degrees, for example between about 30 and 60 degrees and for example substantially 45 degrees in an embodiment. In this way, it is prevented that both encoders EC are facing the border BR simultaneously during a transfer from the high precision grid portion HG to the low precision grid portion LG. When one encoder EC faces the border BR, the other encoder EC cooperates with the high precision grid portion HG or the low precision grid portion LG. When both encoders EC would face the border BR simultaneously, the displacement measurement system would lose its reference position. Losing the reference position would require a new calibration setup which may disrupt the operation of the apparatus.

The high precision grid portion HG may be at least partially surrounded by the low precision grid portion LG.

The low precision grid portion LG may be positioned substantially along an outer edge OE of the grid structure. The high precision grid portion HG may be positioned substantially along an inner edge IE of the grid structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example a track, a metrology tool and/or an inspection tool. A track may comprise a tool that applies a layer of resist to a substrate W and develops the exposed resist. Where applicable, the disclosure herein may be applied to such and other substrate processing tools. Further, the substrate W may be processed more than once, for example in order to create a multi-layer IC, so that the term substrate W used herein may also refer to a substrate W that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device MA defines the pattern created on a substrate W. The topography of the patterning device may be pressed into a layer of resist supplied to the substrate W whereupon the resist is cured by applying electromagnetic radiation, heat, pressure or a combination thereof. The patterning device MA is moved out of the resist leaving a pattern in it after the resist is cured.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support structure constructed to support a patterning device, the patterning device being capable of imparting a radiation beam with a pattern to form a patterned radiation beam;
   a substrate table constructed to hold a substrate;
   a projection system configured to project the patterned radiation beam onto a target portion of the substrate; and
   a displacement measuring system arranged to determine a position quantity of a moveable object,
   wherein the moveable object comprises one of the support structure and the substrate table,
   wherein the displacement measuring system comprises an encoder and a grid structure,
   wherein one of the encoder and the grid structure is connected to the moveable object,
   wherein the grid structure comprises a high precision grid portion and a low precision grid portion,
   wherein the encoder is arranged to cooperate with the high precision grid portion to determine the position quantity relative to the grid structure with a high precision,
   wherein the encoder is arranged to cooperate with the low precision grid portion to determine the position quantity relative to the grid structure with a low precision, and
   wherein the high precision grid portion is provided closer to the projection system than the low precision grid portion.

2. The lithographic apparatus according to claim 1, wherein the encoder is arranged to cooperate with the high precision grid portion during projection of the patterned radiation beam onto the target portion of the substrate.

3. The lithographic apparatus according to claim 1, wherein the encoder is arranged to cooperate with the high precision grid portion during an alignment of the patterned radiation beam with the substrate.

4. The lithographic apparatus according to claim 1, wherein at least one of the high precision grid portion and the low precision grid portion has a two-dimensional pattern, wherein the encoder is arranged to cooperate with the two-dimensional pattern to determine the position quantity in at least two directions.

5. The lithographic apparatus according to claim 1, wherein the low precision grid portion at least partly surrounds the high precision grid portion.

6. The lithographic apparatus according to claim 1, wherein the low precision grid portion is substantially along an outer edge of the grid structure.

7. The lithographic apparatus according to claim 1, wherein the high precision grid portion is substantially along an inner edge of the grid structure.

8. The lithographic apparatus according to claim 1, wherein the high precision grid portion is adjacent to the low precision grid portion.

9. A lithographic apparatus comprising:
a moveable object; and
a displacement measuring system arranged to determine a position quantity of the moveable object,
wherein the displacement measuring system comprises an encoder and a grid structure,
wherein one of the encoder and the grid structure is connected to the moveable object,
wherein the grid structure comprises a high precision grid portion and a low precision grid portion,
wherein the encoder is arranged to cooperate with the high precision grid portion to determine the position quantity relative to the grid structure with a high precision,
wherein the encoder is arranged to cooperate with the low precision grid portion to determine the position quantity relative to the grid structure with a low precision, and
wherein the displacement measuring system comprises a further encoder, wherein the grid structure has a border between the high precision grid portion and the low precision grid portion, wherein the encoder and the further encoder are arranged at an offset relative to each other in a direction such that when one of the encoder and the further encoder faces the border, the other of the encoder and the further encoder cooperates with one of the high precision grid portion and the low precision grid portion.

10. The lithographic apparatus according to claim 9, wherein the border comprises a straight part, wherein the smallest angle between the direction and the straight part is between 10 and 80 degrees.

11. A device manufacturing method for transferring a pattern from a patterning device onto a substrate using a lithographic apparatus, wherein the lithographic apparatus comprises a moveable object and a projection system configured to project a patterned radiation beam onto a target portion of a substrate, the method comprising:

moving the moveable object, providing a grid structure comprising a high precision grid portion and a low precision grid portion, providing the high precision rid portion closer to the projection system than the low precision grid portion, measuring with an encoder a position quantity of the moveable object with a high precision relative to the high precision grid portion, and measuring with the encoder the position quantity of the moveable object with a low precision relative to the low precision grid portion.

* * * * *